United States Patent
Lu

(10) Patent No.: US 11,856,755 B2
(45) Date of Patent: Dec. 26, 2023

(54) METHOD FOR MANUFACTURING MEMORY AND MEMORY

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 172 days.

(21) Appl. No.: 17/441,194

(22) PCT Filed: Jun. 30, 2021

(86) PCT No.: PCT/CN2021/103823
§ 371 (c)(1),
(2) Date: Sep. 20, 2021

(87) PCT Pub. No.: WO2022/042021
PCT Pub. Date: Mar. 3, 2022

(65) Prior Publication Data
US 2023/0059275 A1    Feb. 23, 2023

(30) Foreign Application Priority Data

Aug. 31, 2020 (CN) .......................... 202010895429.7

(51) Int. Cl.
H01L 27/108    (2006.01)
H10B 12/00    (2023.01)

(52) U.S. Cl.
CPC ......... H10B 12/482 (2023.02); H10B 12/485 (2023.02)

(58) Field of Classification Search
CPC ..... H10B 12/482; H10B 12/485; H10B 12/00
See application file for complete search history.

(56) References Cited

U.S. PATENT DOCUMENTS

| | | |
|---|---|---|
| 6,750,112 B2 | 6/2004 | Kieslich |
| 6,916,738 B2 | 7/2005 | Lee et al. |
| 10,600,790 B2 | 3/2020 | Feng et al. |

(Continued)

FOREIGN PATENT DOCUMENTS

| | | |
|---|---|---|
| CN | 1525570 A | 9/2004 |
| CN | 109244090 A | 1/2019 |
| CN | 110957320 A | 4/2020 |

OTHER PUBLICATIONS

International Search Report cited in PCT/CN2021/103823 dated Sep. 27, 2021, 9 pages.

*Primary Examiner* — Mohammed R Alam
(74) *Attorney, Agent, or Firm* — Cooper Legal Group, LLC

(57) ABSTRACT

The present disclosure provides a method for manufacturing a memory, including: providing a substrate, and forming a sacrificial layer on the substrate; patterning the sacrificial layer, and forming a plurality of discrete pseudo bit line layers on the substrate; forming a support layer, the support layer filling areas between the adjacent pseudo bit line layers; removing the pseudo bit line layers to form bit line spaces between adjacent parts of the support layer; forming bit line structures, the bit line structures filling the bit line spaces, and the bit line structures including a bit line conductive layer and a bit line insulating layer sequentially stacked; and removing the support layer, and forming openings between the adjacent bit line structures.

10 Claims, 8 Drawing Sheets

(56) References Cited

U.S. PATENT DOCUMENTS

2016/0111326 A1    4/2016  Ohori et al.
2016/0126179 A1    5/2016  Takahashi et al.
2019/0019805 A1*   1/2019  Feng .................... H10B 12/482
2021/0035613 A1*   2/2021  Park .................... H10B 12/485

* cited by examiner

METHOD FOR MANUFACTURING MEMORY AND MEMORY

CROSS-REFERENCE TO RELATED APPLICATIONS

The present disclosure is a national stage entry of International Application No. PCT/CN2021/103823, filed on Jun. 30, 2021, which claims the priority to Chinese Patent Application 202010895429.7, titled "METHOD FOR MANUFACTURING MEMORY AND MEMORY", filed to the CNIPA on Aug. 31, 2020. The entire contents of International Application No. PCT/CN2021/103823 and Chinese Patent Application 202010895429.7 are incorporated herein by reference.

TECHNICAL FIELD

The present disclosure relates to, but is not limited to, a method for manufacturing a memory and a memory.

BACKGROUND

Memories are memory components configured to store programs and various data information, and can be divided into read-only memories and random access memories according to types of use. A memory usually includes capacitors and transistors connected with the capacitors. The capacitors are configured to store charges representing stored information, and the transistors are switches that control the inflow and release of charges from the capacitors. A bit line conductive layer serves as a part of bit line structures of the memory, and constitutes the bit line structures of the memory together with a bit line insulating layer. The bit line structures are formed by depositing the bit line conductive layer and the bit line insulating layer sequentially, and then etching the bit line conductive layer and the bit line insulating layer into discrete bit line structures.

However, when the bit line structures are etched, the etching depth needs to be deeper, side walls of the bit line structures etched are often not vertical enough, and the bit line conductive layer may be over-etched, resulting in damage of the bit line conductive layer to affect the conductivity of the bit line structures.

SUMMARY

The following is a summary of subject matters detailed in the present disclosure. The summary is not intended to limit the protection scope of the claims.

Embodiments of the present disclosure provide a method for manufacturing a memory, including: providing a substrate, and forming a sacrificial layer on the substrate; patterning the sacrificial layer, and forming a plurality of discrete pseudo bit line layers on the substrate; forming a support layer, the support layer filling areas between the adjacent pseudo bit line layers; removing the pseudo bit line layers to form bit line spaces between adjacent parts of the support layer; forming bit line structures, the bit line structures filling the bit line spaces, and the bit line structures including a bit line conductive layer and a bit line insulating layer sequentially stacked; and removing the support layer and forming openings between the adjacent bit line structures.

Embodiments of the present disclosure provide a memory, and the memory is formed according to the above-mentioned method for manufacturing a memory.

Other aspects will be understood upon reading and understanding the accompanying drawings and detailed description.

BRIEF DESCRIPTION OF THE DRAWINGS

One or more embodiments are exemplified by corresponding drawings. These exemplary descriptions do not constitute limitations on the embodiments. The elements with the same reference numerals in the drawings are denoted as similar elements. Unless otherwise stated, the drawings do not constitute proportional limitations. For those skilled in the art, other drawings may be obtained based on these drawings without any creative efforts.

DETAILED DESCRIPTION

Figure 1:
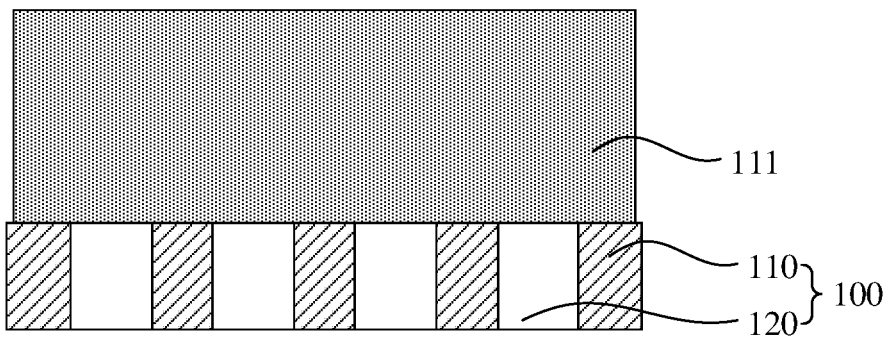
FIG. 1 is a schematic cross-sectional structure diagram of a step of forming a sacrificial layer on a substrate according to an embodiment of the present disclosure.

In order to make the objectives, technical solutions and advantages of the embodiments of the present disclosure clearer, the embodiments of the present disclosure will be described in detail below with reference to the accompanying drawings. However, those skilled in the art can understand that, in each embodiment of the present disclosure, many technical details are proposed in order to enable a reader to better understand the present application. However, the technical solutions claimed in the present application can also be implemented without these technical details and various variations and modifications based on the following embodiments.

It can be seen from the background that the performance of the memory in the prior art needs to be improved. The bit line structures of the memory include a bit line conductive layer and a bit line insulating layer. When the bit line structures are formed, the etching depth often needs to be deeper. Due to the difference in the etching selectivity of the etchant for different structures, trenches are formed in side wall profiles of the bit line structures. After bit line contact windows are formed by etching, further etching is required to remove the bit line contact material remaining between the bit line contact windows. This avoids short circuit caused by contact of a plurality of adjacent bit line structures. This process also results in over-etching of two side walls of the bit line contact windows. As the etching progresses, phenomenon of transverse etching will gradually occur. The etching will cause morphological defects in the bit line conductive layer. Meanwhile, the bit line conductive layer will be over-etched and the bit line conductive layer will be damaged to affect the electrical performance of the memory.

Embodiments of the present disclosure provide a method for manufacturing a memory, in which a sacrificial layer is patterned and pseudo bit line layers are formed, the pseudo bit line layers can define positions of bit line structures; areas between the pseudo bit line layers are filled with a support layer to define positions of areas between the bit line structures; and the pseudo bit line layers are removed to form bit line spaces between parts of the support layer, the bit line structures are sequentially filled, and the support layer is removed. The manufacturing method provided by the embodiments of the present disclosure avoids morphological defects of the bit line conductive layer when the bit line structures are formed by etching, and can also avoid over-etching of the bit line conductive layer and avoid damage of the bit line conductive layer, thereby improving the conductivity of the bit line conductive layer and improving the electrical performance of the memory.

Embodiments of the present disclosure provide a method for manufacturing a memory. The method for manufacturing a memory provided by this embodiment will be described in detail below with reference to the accompanying drawings. FIGS. 1 to 17 are schematic cross-sectional structure diagrams corresponding to various steps of the method for manufacturing a memory provided by embodiments of the present disclosure.

Referring to FIG. 1, a substrate 100 is provided, and a sacrificial layer 111 is formed on the substrate 100.

The substrate 100 has active areas (AA) 110, isolation areas 120 are disposed between the active areas 110, and the isolation areas 120 are configured to isolate the adjacent active areas 110.

In some embodiments of the present disclosure, the sacrificial layer 111 is of a single-layer structure. In other embodiments, the sacrificial layer may also be of a stacked-layer structure.

The material of the sacrificial layer 111 is silicon dioxide. When the same material is etched, the anisotropies in all directions are almost the same, so that over-etching can be effectively avoided. In other embodiments, the material of the sacrificial layer may also be other materials.

The sacrificial layer 111 is formed by chemical vapor deposition at a temperature of 600° C. to 630° C., such as 605° C., 610° C., 615° C., 620° C., or 625° C., etc. In other embodiments, the deposition process may also be physical vapor deposition or atomic layer deposition.

Figure 2:
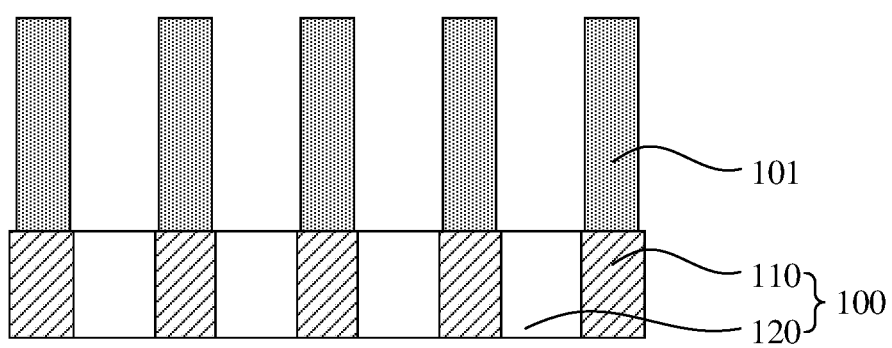
FIG. 2 is a schematic cross-sectional structure diagram of a step of forming pseudo bit line layers on the substrate according to an embodiment of the present disclosure.

Referring to FIG. 2, the sacrificial layer 111 is patterned (refer to FIG. 1) and a plurality of discrete pseudo bit line layers 101 are formed on the substrate 100.

The function of the pseudo bit line layers 101 includes defining the positions of bit line structures so as to form the bit line structures later. The pseudo bit line layers 101 are located above the active areas 110 and at the gaps between the isolation areas 120, and the side wall profiles of the pseudo bit line layers 101 are smooth and perpendicular to the substrate 100.

The process step after forming the pseudo bit line layers 101 includes: forming a support layer 102, the support layer 102 filling the areas between the adjacent pseudo bit line layers 101.

Figure 3:
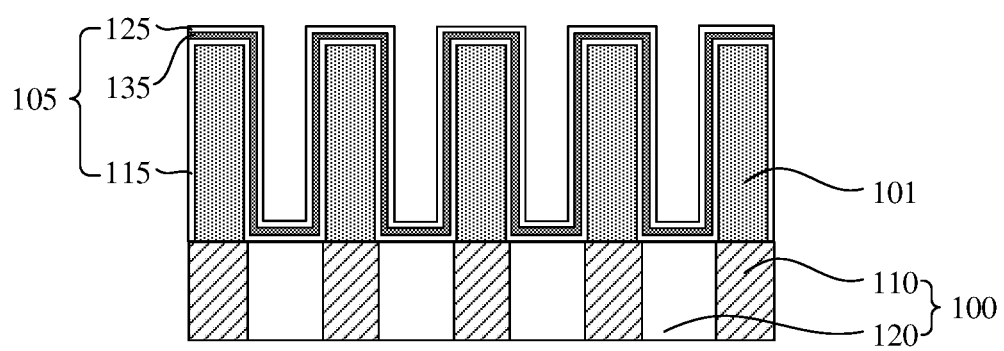
FIG. 3 is a schematic cross-sectional structure diagram of a step of forming a protective layer according to an embodiment of the present disclosure.

In some embodiments of the present disclosure, before forming the support layer 102, the method for manufacturing the memory further includes: referring to FIG. 3, forming a protective layer 105, the protective layer 105 covering side walls of the pseudo bit line layers 101 and also located on parts of the substrate 100 between the adjacent pseudo bit line layers 101.

The protective layer 105 can protect a bit line conductive layer in the bit line structures formed in the subsequent process step, and further improve the insulation between the bit line conductive layer and capacitor contact windows formed later in the memory manufacturing process.

In some embodiments of the present disclosure, the process steps of forming the protective layer 105 include: forming a first silicon nitride layer 115 covering the side walls of the pseudo bit line layers 101 and parts of the substrate 100 between the adjacent pseudo bit line layers 101; forming a silicon oxide layer 135 on the first silicon nitride layer 115; and forming a second silicon nitride layer 125 on the silicon oxide layer 135.

In some embodiments of the present disclosure, the first silicon nitride layer 115 and the second silicon nitride layer 125 may be formed by atomic layer deposition, and the reaction gas may be silane, ammonia, etc. The silicon oxide layer 135 may be formed by atomic layer deposition, and the reaction gas may be dipropylaminosilane. In other embodiments, the protective layer may also be formed by chemical vapor deposition or physical vapor deposition, and the reaction gas may also be other gases.

In other embodiments, the protective layer may also be of a single-layer structure or a double-layer structure.

In other embodiments, the protective layer may also be formed after the bit line structures are formed.

Figure 4:
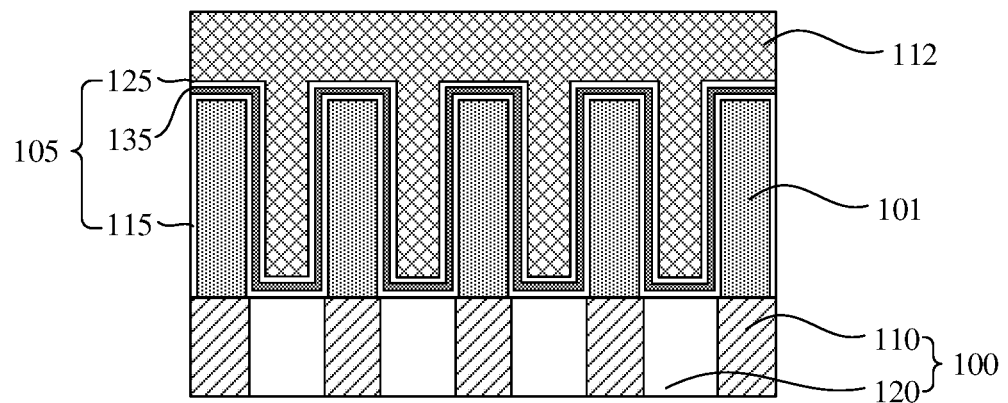
FIG. 4 is a schematic cross-sectional structure diagram of a step of forming an initial support layer according to an embodiment of the present disclosure.

Referring to FIG. 4, an initial support layer 112 is formed between the adjacent pseudo bit line layers 101, and the initial support layer 112 is also located on the tops of the pseudo bit line layers 101.

In this embodiment, the initial support layer 112 is formed on the surface of the protective layer 105.

Figure 5:
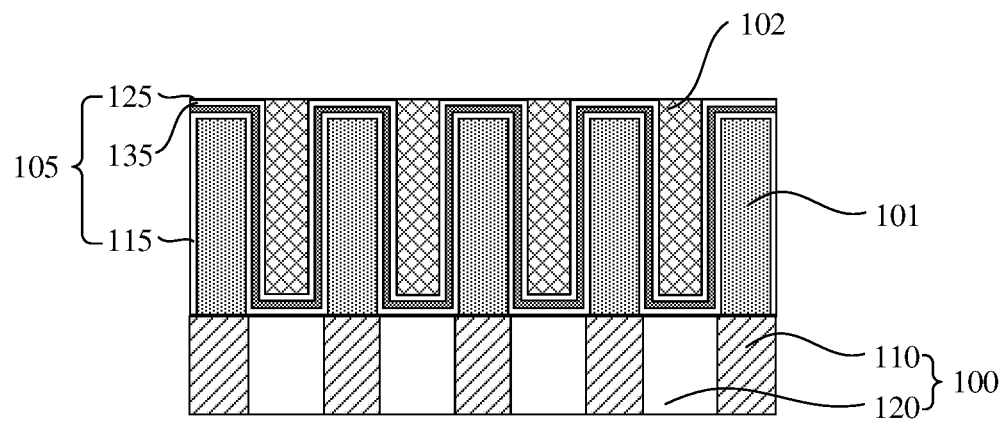
FIG. 5 is a schematic cross-sectional structure diagram of a step of forming a support layer according to an embodiment of the present disclosure.

Referring to FIG. 5, the initial support layer 112 (refer to FIG. 4) is planarized, to remove parts of the initial support layer 112 higher than the tops of the pseudo bit line layers 101, so as to form the support layer 102.

Parts of the initial support layer 112 higher than the tops of the pseudo bit line layers 101 may be removed by dry etching, and the etching gas may be sulfur hexafluoride, carbon tetrafluoride, trifluoromethane, oxygen, argon, etc., or a mixed gas thereof. In other embodiments, parts of the initial support layer higher than the tops of the pseudo bit line layers may also be removed by other processes.

The material of the support layer 102 is polysilicon, the support layer 102 is formed by chemical vapor deposition, the reaction gas may be silane, and the process temperature is 580° C. to 620° C., such as 585° C., 596° C., 600° C., or 610° C., etc.

Figure 6:
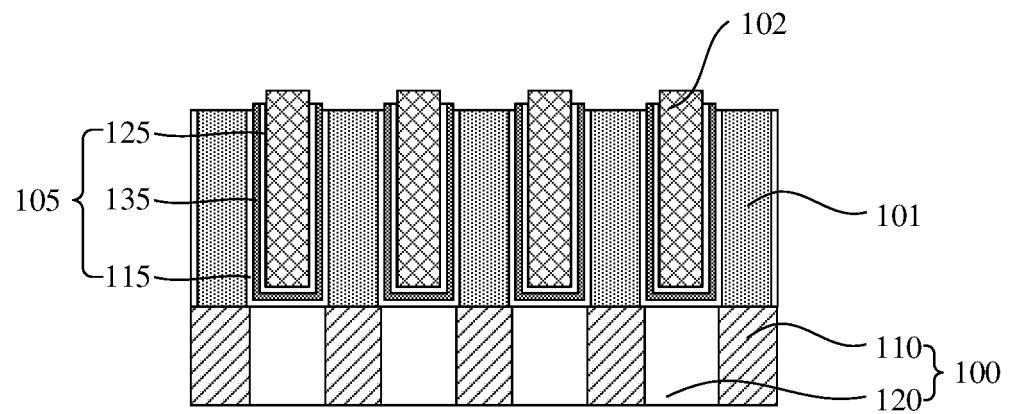
FIG. 6 is a schematic cross-sectional structure diagram of a step of removing parts of the protective layer on the tops of the pseudo bit line layers according to an embodiment of the present disclosure.

Referring to FIG. 6, parts of the protective layer 105 on the tops of the pseudo bit line layers 101 are removed.

The protective layer 105 is also formed before the support layer 102 are formed, and the protective layer 105 covers the side walls and tops of the pseudo bit line layers 101, so parts of the protective layer 105 on the tops of the pseudo bit line layers 101 may also be removed before the pseudo bit line layers 101 are removed, to expose the pseudo bit line layers 101, which facilitates subsequent removal of the pseudo bit line layers 101.

Parts of the protective layer 105 may be removed by dry etching, and the etching gas may be a mixed gas of sulfur hexafluoride, carbon tetrafluoride, trifluoromethane, oxygen, argon, etc.

Figure 7:
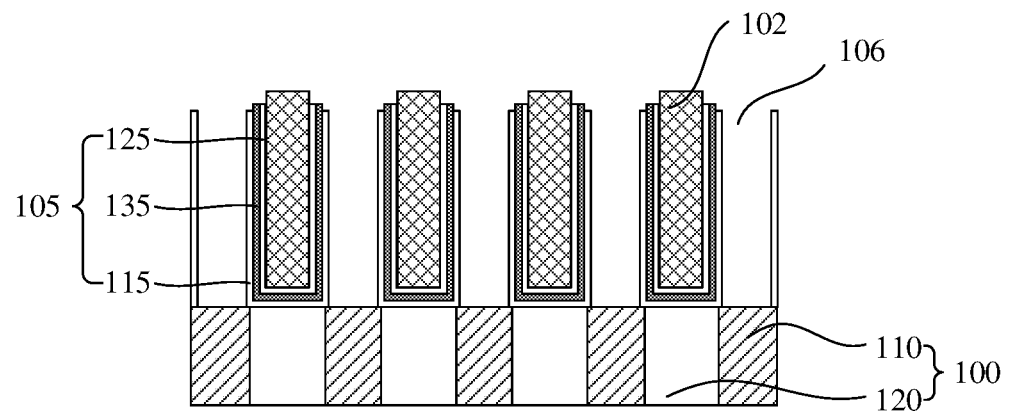
FIG. 7 is a schematic cross-sectional structure diagram of a step of removing the pseudo bit line layers according to an embodiment of the present disclosure.

Referring to FIG. 7, the pseudo bit line layers 101 are removed to form bit line spaces 106 between the adjacent parts of the support layer 102.

In some embodiments of the present disclosure, the side walls of the bit line spaces 106 are parts of the protective layer 105.

The pseudo bit line layers 101 may be removed by wet etching, and the etching liquid for the wet etching is a hydrofluoric acid solution.

The process step after removing the pseudo bit line layers 101 includes: forming bit line structures, the bit line structures filling the bit line spaces 106, and the bit line structures including a bit line conductive layer 103 and a bit line insulating layer 104 sequentially stacked.

The process steps of forming the bit line structures include: forming the bit line conductive layer 103 in the bit line spaces 106, the top of the bit line conductive layer 103 being lower than that of the support layer 102; and forming the bit line insulating layer 104 on the top of the bit line conductive layer 103, the bit line insulating layer 104 exposing the top of the support layer 102. The steps of forming the bit line structures will be described in detail below with reference to the accompanying drawings.

Figure 8:
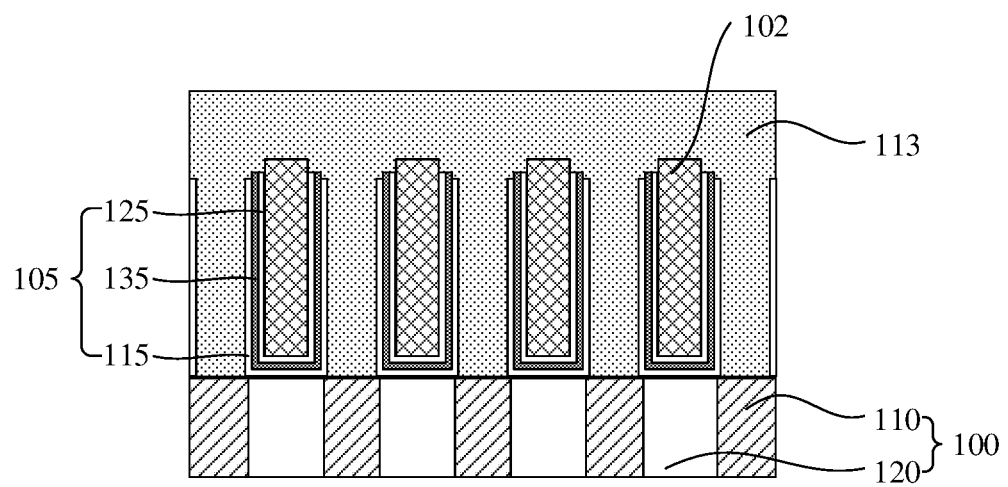
FIG. 8 is a schematic cross-sectional structure diagram of a step of forming a first conductive layer according to an embodiment of the present disclosure.
Figure 9:
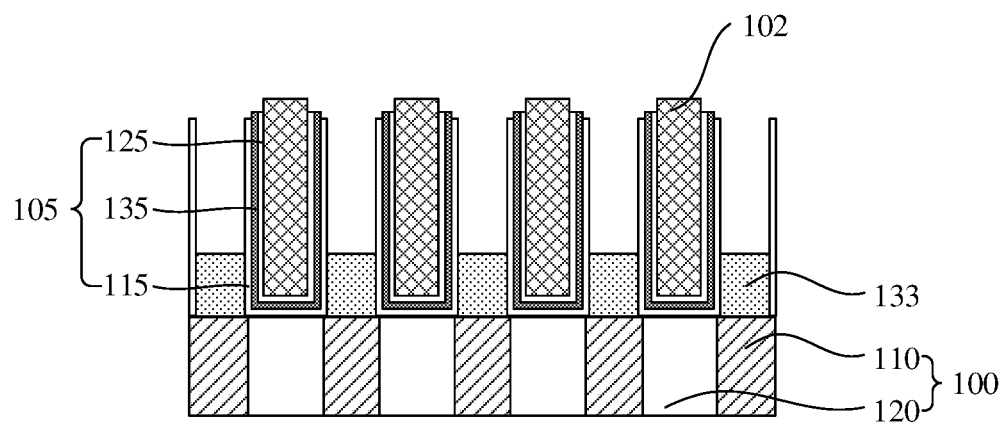
FIG. 9 is a schematic cross-sectional structure diagram of a step of removing a partial thickness of the first conductive layer by back-etching according to an embodiment of the present disclosure.

Referring to FIG. 8, a first conductive layer 113 filling the bit line spaces 106 is formed; and referring to FIG. 9, a partial thickness of the first conductive layer 113 is removed by back-etching, the remaining parts of the first conductive layer 113 serving as bit line contact windows 133.

In some embodiments of the present disclosure, the bit line conductive layer 103 includes the bit line contact windows 133, the material of the support layer 102 is the same as that of the bit line contact windows 133, and the process temperature of forming the initial support layer 112 is higher than that of forming the bit line contact windows 133.

In some embodiments of the present disclosure, the material of the bit line contact windows 133 is polysilicon, wherein the material forming the bit line contact windows 133 also has doped ions. The bit line contact windows 133 are configured to realize the electrical connection between the bit line structures and the active areas 110.

The bit line contact windows 133 are formed by chemical vapor deposition, the reaction gas is silane and phosphine, and the process temperature is 480° C. to 520° C., such as 485° C., 490° C., 500° C., or 510° C., etc. It can be understood that, since the process temperature of forming the support layer 102 is higher than that of forming the bit line contact windows 133, the etching rate of the support layer 102 is much lower than that of the first conductive layer 113. Therefore, when the first conductive layer 113 is wet-etched with the same concentration of nitric acid solution, the support layer 102 is almost not affected.

Figure 10:
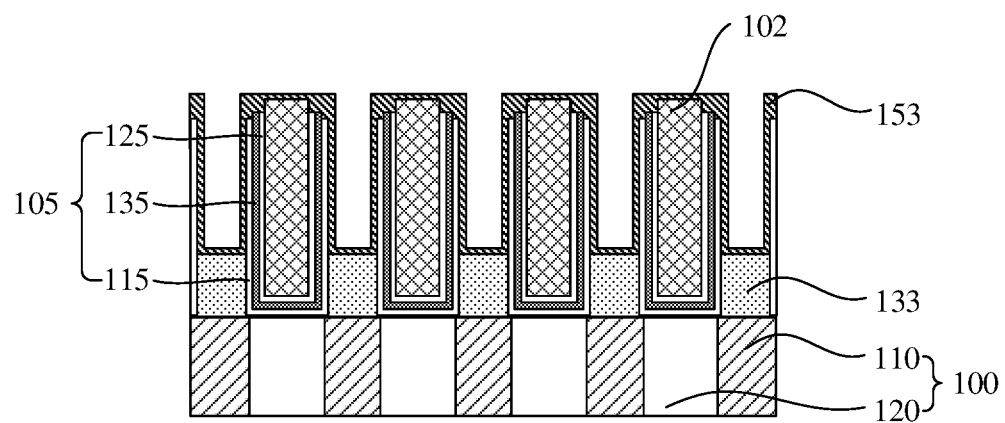
FIG. 10 is a schematic cross-sectional structure diagram of a step of forming a diffusion barrier layer according to an embodiment of the present disclosure.
Figure 11:
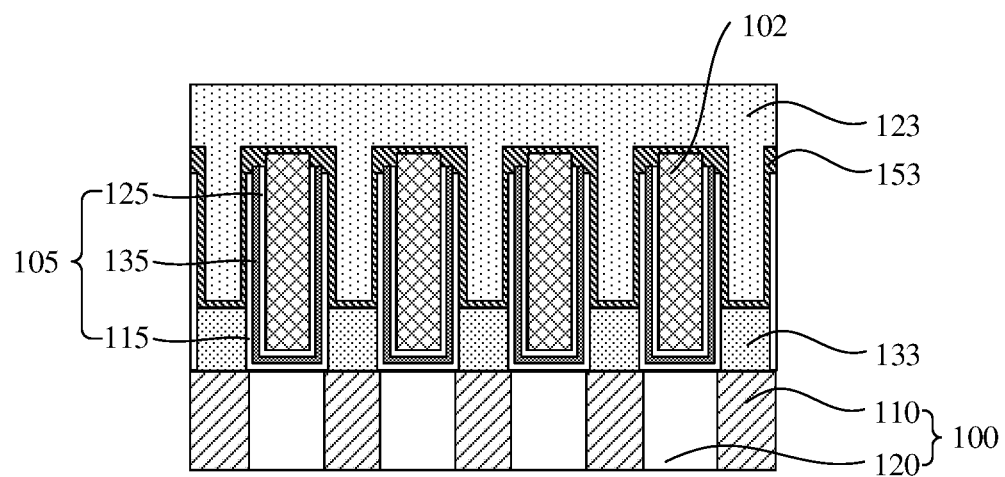
FIG. 11 is a schematic cross-sectional structure diagram of a step of forming a second conductive layer according to an embodiment of the present disclosure.

Referring to FIGS. 10 and 11, a second conductive layer 123 filling the bit line spaces 106 is formed on the bit line contact windows 133.

In some embodiments of the present disclosure, a diffusion barrier layer 153 may be formed between the bit line contact windows 133 and bit line conductive pillars 143, and the material of the diffusion barrier layer 153 may be tantalum nitride or titanium nitride.

Figure 12:
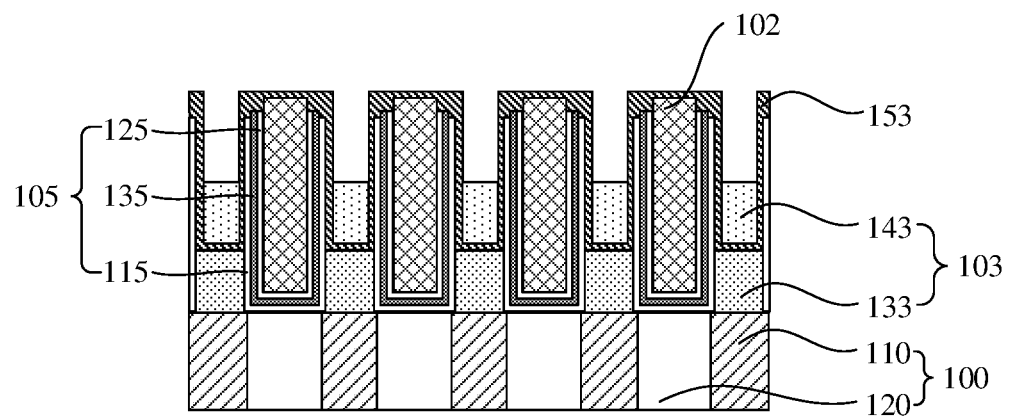
FIG. 12 is a schematic cross-sectional structure diagram of a step of removing a partial thickness of the second conductive layer by back-etching according to an embodiment of the present disclosure.

Referring to FIG. 12, a partial thickness of the second conductive layer 123 is removed by back-etching, the remaining parts of the second conductive layer 123 serve as bit line conductive pillars 143.

The material of the bit line conductive pillars 143 includes metal conductive materials such as tungsten, gold, or silver, etc.

Figure 13:
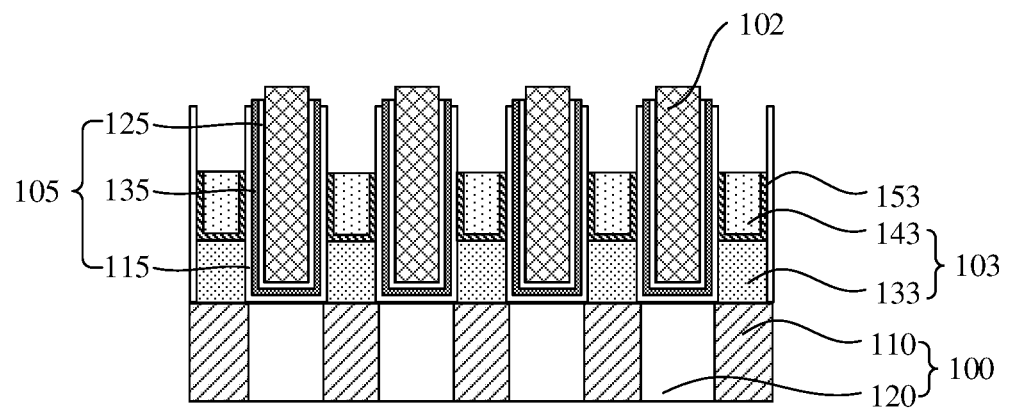
FIG. 13 is a schematic cross-sectional structure diagram of a step of back-etching the diffusion barrier layer according to an embodiment of the present disclosure.

Referring to FIG. 13, the diffusion barrier layer 153 is etched back.

Before the bit line insulating layer 104 is filled, the diffusion barrier layer 153 may be etched back.

In some embodiments of the present disclosure, a partial thickness of the first conductive layer 113 is removed by wet back-etching. According to actual requirements, a partial thickness of the first conductive layer 113 may also be removed by other etching processes to form the bit line contact windows 133. The thickness removed of the first conductive layer 113 is determined according to the bit line conductive layer in the bit line structures of the memory.

In some embodiments of the present disclosure, the bit line conductive layer 103 includes the bit line contact windows 133 and the bit line conductive pillars 143 sequentially stacked.

Figure 14:
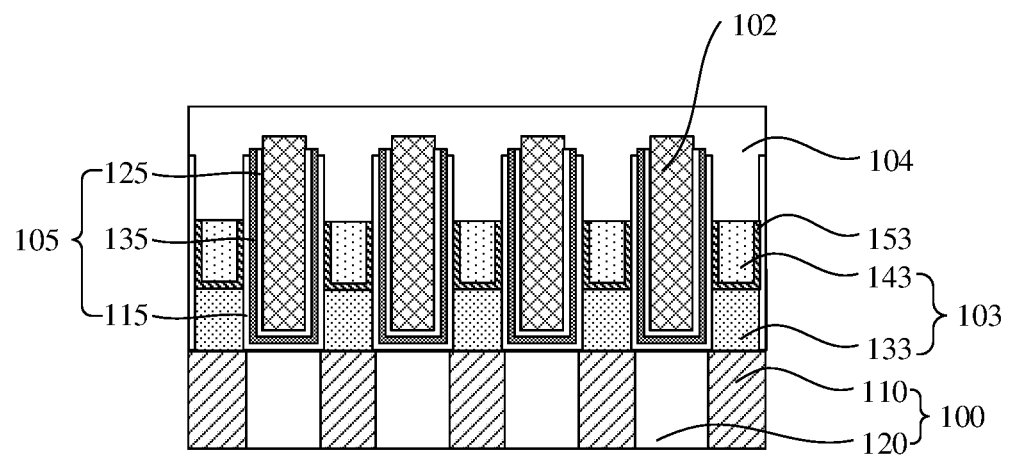
FIG. 14 is a schematic cross-sectional structure diagram of a step of forming a bit line insulating layer on tops of bit line conductive layer according to an embodiment of the present disclosure.
Figure 15:
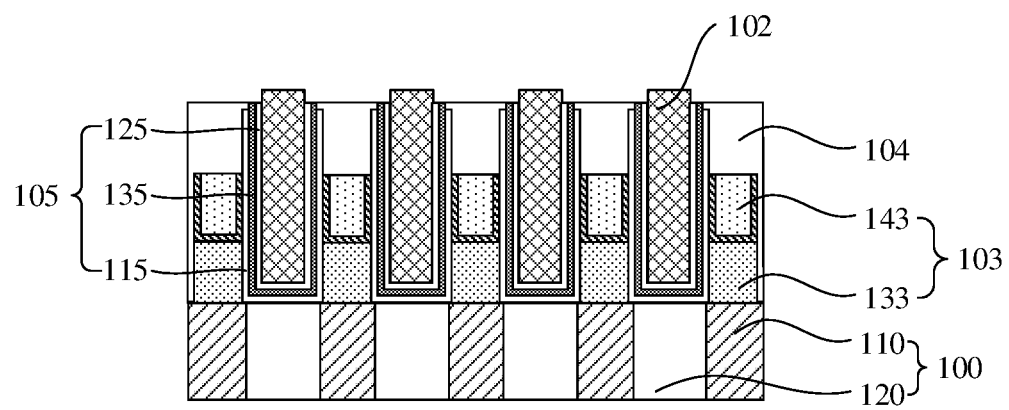
FIG. 15 is a schematic cross-sectional structure diagram of a step of back-etching the bit line insulating layer to expose the top of the support layer according to an embodiment of the present disclosure.

Referring to FIGS. 14 and 15, a bit line insulating layer 104 is formed on the top of the bit line conductive layer 103, and the bit line insulating layer 104 exposes the top of the support layer 102.

The process steps of forming the bit line insulating layer 104 include: referring to FIG. 14, forming the bit line insulating layer 104 on the top of the bit line conductive layer 103; and referring to FIG. 15, etching the bit line insulating layer 104 back until the top of the support layer 102 is exposed. The main function of the bit line insulating layer 104 is to insulate the surfaces of the bit line structures.

The formed bit line structures includes a bit line conductive layer and a bit line insulating layer sequentially stacked, and the formed bit line conductive layer avoids morphological defects of the bit line conductive layer formed by etching the bit line structures in the prior art and over-etching of the bit line conductive layer.

In some embodiments of the present disclosure, the material of the support layer 102 is different from that of the bit line insulating layer 104.

In some embodiments of the present disclosure, the material of the bit line insulating layer 104 includes silicon nitride. In other embodiments, the material of the bit line insulating layer may also be silicon oxide, silicon oxynitride, or silicon carbon oxynitride.

Figure 16:
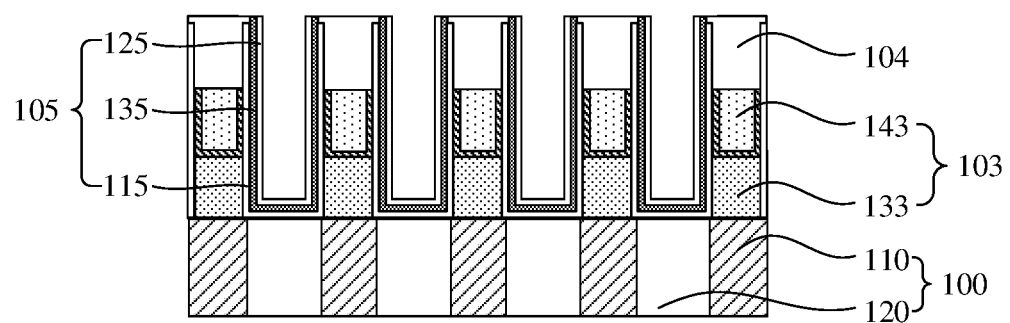
FIG. 16 is a schematic cross-sectional structure diagram of a step of removing the support layer according to an embodiment of the present disclosure.

Referring to FIG. 16, the support layer 102 is removed and openings between the adjacent bit line structures are formed.

The support layer 102 may be removed by dry etching, and the etching gas may be sulfur hexafluoride, carbon tetrafluoride, chlorine, argon, etc., or a mixed gas thereof. During the removal of the support layer 102, the protective layer 105 can effectively avoid etching of the bit line conductive layer 103 in the bit line structures.

In other embodiments, the support layer may also be removed by other processes.

Figure 17:
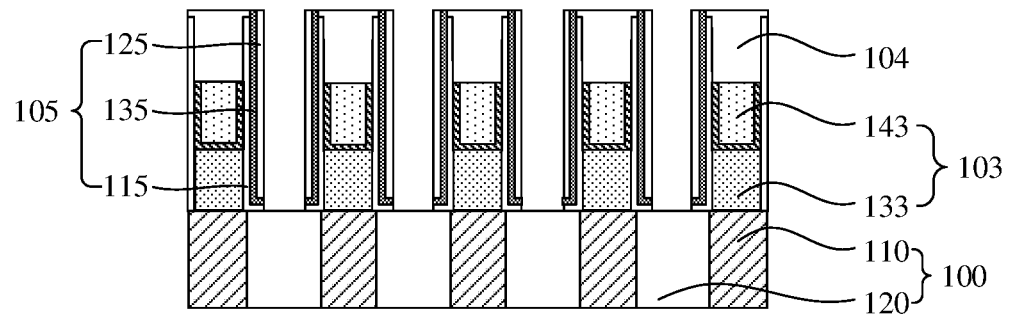
FIG. 17 is a schematic cross-sectional structure diagram of a step of removing parts of the protective layer on the substrate between the adjacent bit line structures according to an embodiment of the present disclosure.

Referring to FIG. 17, after the support layer 102 is removed, the method further includes: removing parts of the protective layer 105 on the substrate 100 between the adjacent bit line structures.

Parts of the protective layer 105 cover the side walls of the bit line structures and are also located on parts of the substrate 100 between the adjacent bit line structures. Therefore, after the support layer 102 is removed, parts of the protective layer 105 on parts of the substrate 100 between the adjacent bit line structures may also be removed, to expose parts of the substrate 100, so as to form discrete bit line structures on the substrate 100.

According to the method for manufacturing a memory provided in some embodiments of the present disclosure, pseudo bit line layers without etching defects are formed first to define the positions of bit line structures, then the positions of areas between the bit line structures are defined by a support layer, bit line spaces are formed between the support layer, a bit line conductive layer and a bit line insulating layer are sequentially filled to form bit line structures, and finally the support layer is removed to form bit line structures without etching defects. The method for manufacturing a memory provided in this embodiment avoids morphological defects of the bit line conductive layer when the bit line structures are formed by etching, and can also avoid over-etching of the bit line conductive layer and avoid damage of the bit line conductive layer, thereby improving the conductivity of the bit line conductive layer and improving the electrical performance of the memory.

A person skilled in the art would easily conceive of other implementations of the present disclosure after considering the specification and the disclosure of practice. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The specification and the embodiments are merely regarded as exemplary, and the real scope and spirit of the present disclosure are pointed out by the following claims.

It should be understood that the present disclosure is not limited to the precise structure described above and shown in the drawings, and various modifications and changes can be made without departing from its scope. The scope of the present disclosure is only limited by the appended claims.

INDUSTRIAL APPLICABILITY

The method for manufacturing a memory provided in the present disclosure avoids morphological defects of the bit line conductive layer when the bit line structures are formed by etching, and can also avoid over-etching of the bit line conductive layer and avoid damage of the bit line conductive layer, thereby improving the conductivity of the bit line conductive layer and improving the electrical performance of the memory.

The invention claimed is:

1. A method for manufacturing a memory, comprising:
providing a substrate, and forming a sacrificial layer on the substrate;
patterning the sacrificial layer, and forming a plurality of discrete pseudo bit line layers on the substrate;
forming a support layer, the support layer filling areas between the adjacent pseudo bit line layers of the pseudo bit line layers;
removing the pseudo bit line layers to form bit line spaces between adjacent parts of the support layer;
forming bit line structures, the bit line structures filling the bit line spaces, and the bit line structures comprising a bit line conductive layer and a bit line insulating layer sequentially stacked; and
removing the support layer, and forming openings between adjacent bit line structures of the bit line structures.

2. The method for manufacturing a memory according to claim 1, wherein process steps of forming the bit line structures comprise: forming the bit line conductive layer in the bit line spaces, a top of the bit line conductive layer being lower than a top of the support layer; and forming the bit line insulating layer on the top of the bit line conductive layer, the bit line insulating layer exposing the top of the support layer.

3. The method for manufacturing a memory according to claim 2, wherein the bit line conductive layer comprises bit line contact windows and bit line conductive pillars sequentially stacked; process steps of forming the bit line conductive layer comprise: forming a first conductive layer filling the bit line spaces; removing a partial thickness of the first conductive layer by back-etching, remaining parts of the first conductive layer serving as the bit line contact windows; forming a second conductive layer filling the bit line spaces on the bit line contact windows; and removing a partial thickness of the second conductive layer by back-etching, remaining parts of the second conductive layer serving as the bit line conductive pillars.

4. The method for manufacturing a memory according to claim 3, wherein the partial thickness of the first conductive layer is removed by wet back-etching.

5. The method for manufacturing a memory according to claim 1, wherein process steps of forming the support layer comprise: forming an initial support layer between the adjacent pseudo bit line layers, the initial support layer being also located at tops of the pseudo bit line layers; and planarizing the initial support layer, removing parts of the initial support layer higher than the tops of the pseudo bit line layers, and forming the support layer; wherein the bit line conductive layer comprises bit line contact windows, material of the support layer is the same as material of the bit line contact windows, and a process temperature of forming the initial support layer is greater than a process temperature of forming the bit line contact windows.

6. The method for manufacturing a memory according to claim 5, wherein the material of the support layer and the bit line contact windows is polysilicon, wherein the material of the bit line contact windows also has doped ions; the process temperature of forming the initial support layer is 580° C. to 620° C., and the process temperature of forming the bit line contact windows is 480° C. to 520° C.

7. The method for manufacturing a memory according to claim 1, wherein material of the support layer is different from material of the bit line insulating layer.

8. The method for manufacturing a memory according to claim 1, before forming the support layer, the method for manufacturing further comprises: forming a protective layer, the protective layer covering side walls of the pseudo bit line layers and being also located on parts of the substrate between the adjacent pseudo bit line layers; and after removing the support layer, the method further comprises: removing parts of the protective layer on the parts of the substrate between the adjacent bit line structures.

9. The method for manufacturing a memory according to claim 8, wherein process steps of forming the protective layer comprise: forming a first silicon nitride layer covering the side walls of the pseudo bit line layers and the parts of the substrate between the adjacent pseudo bit line layers; forming a silicon oxide layer on the first silicon nitride layer; and forming a second silicon nitride layer on the silicon oxide layer.

10. The method for manufacturing a memory according to claim 1, wherein the sacrificial layer is of a single-layer structure.

* * * * *